United States Patent
Park et al.

(10) Patent No.: US 7,479,793 B2
(45) Date of Patent: Jan. 20, 2009

(54) APPARATUS FOR TESTING SEMICONDUCTOR TEST SYSTEM AND METHOD THEREOF

(75) Inventors: Byung-Wook Park, Suwon-si (KR); Byeong-Hwan Cho, Yongin-si (KR); Young-Dong Nam, Seongnam-si (KR); Bo-Yeon Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/635,745

(22) Filed: Dec. 7, 2006

(65) Prior Publication Data

US 2007/0170939 A1  Jul. 26, 2007

(30) Foreign Application Priority Data

Jan. 24, 2006  (KR) .................... 10-2006-0007418

(51) Int. Cl.
*G01R 31/02* (2006.01)
*G01R 31/26* (2006.01)

(52) U.S. Cl. ...................... 324/754; 324/765

(58) Field of Classification Search .............. 324/158.1, 324/754, 765
See application file for complete search history.

(56) References Cited

U.S. PATENT DOCUMENTS

| | | | | |
|---|---|---|---|---|
| 5,448,164 A | * | 9/1995 | Selley et al. | 324/158.1 |
| 5,705,935 A | * | 1/1998 | Nishimura | 324/764 |
| 5,747,944 A | * | 5/1998 | Harada | 315/241 P |
| 5,986,458 A | * | 11/1999 | Saito et al. | 324/754 |
| 6,750,667 B2 | * | 6/2004 | Chang | 324/758 |
| 6,822,467 B2 | * | 11/2004 | Tervo et al. | 324/762 |
| 2005/0017708 A1 | * | 1/2005 | Miller et al. | 324/158.1 |

FOREIGN PATENT DOCUMENTS

| | | |
|---|---|---|
| JP | 6-104322 | 4/1994 |
| JP | 2003-282654 | 10/2003 |
| JP | 2003282654 | 10/2003 |
| KR | 1998-027150 | 8/1998 |
| KR | 200169688 | 11/1999 |
| KR | 2001-0044350 | 6/2001 |
| KR | 2003-0094790 | 12/2003 |
| KR | 100470989 B1 | 2/2005 |
| KR | 10-2005-0066413 | 6/2005 |

* cited by examiner

*Primary Examiner*—Ha Tran T Nguyen
*Assistant Examiner*—Joshua Benitez
(74) *Attorney, Agent, or Firm*—Mills & Onello, LLP

(57) ABSTRACT

A test system includes a tester configured to perform a test operation on a semiconductor wafer; an interface unit configured to interface between the tester and the semiconductor wafer; and a conductive plate configured to provide the interface unit with a current path when the interface unit is determined to be defective.

4 Claims, 5 Drawing Sheets

APPARATUS FOR TESTING SEMICONDUCTOR TEST SYSTEM AND METHOD THEREOF

CROSS-REFERENCE TO RELATED APPLICATIONS

This U.S. non-provisional patent application claims priority under 35 U.S.C § 119 of Korean Patent Application 10-2006-0007418, filed in the Korean Intellectual Property Office on Jan. 24, 2006, the entire contents of which are hereby incorporated by reference.

BACKGROUND OF THE INVENTION

The present invention relates to a test system for testing a semiconductor device and, more particularly, a test apparatus and method for readily detecting malfunction of the test system.

In general, a semiconductor device fabricating procedure includes a die sort test operation that is performed after wafer level processes are completed. Specifically, an electrical die sort (EDS) test operation for testing electric characteristics may be carried out to test circuit characteristics or reliability of chip dies and to sort and mark good and bad dies. An interconnection unit may be provided which electrically connects test equipment and a wafer. For example, the interconnection unit may be a probe card that is connected to a test head and a wafer so as to apply electrical signals. The test head and the probe card are electrically connected through a pogo pin inserted therebetween.

However, electrical interconnection between the constituent elements such as the test head, the probe card and the pogo pin can become unstable in a test operation. It is preferable to precisely align the constituent elements such as the test head, the probe card and the pogo pin because of the necessity of fine contact with pads of a high-integration chip die. Since tips of the probe card can become degraded due to repetitive contacts, the electrical connection between the tips and a chip die becomes unstable. In addition, the connection between the probe card tips and the pogo pins can malfunction due to minute dust or particles. In particular, probe card tips may be shorted when conductive minute dust is present, or the connection between chip die pads and probe card tips may be opened when non-conductive minute dust is present. Probe card tips and chip die pads may be not connected due to abrasion of probe card tips caused by repetitive contacts. It is difficult to detect problems of the test apparatus during a test operation. Furthermore, it is difficult to detect the positions at which the problems are caused. This causes decrease in the efficiency of the test operation.

SUMMARY OF THE INVENTION

According to one aspect, the present invention is directed to a test system which comprises a tester configured to perform a test operation on a semiconductor wafer; an interface unit configured to interface between the tester and the semiconductor wafer; and a conductive plate configured to provide the interface unit with a current path when the interface unit is determined to be defective.

In one embodiment, the interface unit comprises: a pogo connector including a plurality of pogo pins; and a probe card connected with the tester through the pogo connector. In one embodiment, the conductive plate is formed on one of chip regions of the semiconductor wafer. In one embodiment, the conductive plate is formed of a conductive film on an entire surface of the chip region.

In one embodiment, the interface unit comprises a pogo connector having a plurality of pogo pins. In one embodiment, the conductive plate is connected with the plurality of pogo pins to provide the current path. In one embodiment, the conductive plate provides a predetermined resistance to current paths each formed by the pogo pins.

According to another aspect, the present invention is directed to a test system which comprises a tester configured to test a wafer having a plurality of chip regions; a probe card configured to transfer test signals from the tester to the wafer; a pogo connector configured to be connected with the tester and the probe card; and a conductive film formed on an entire surface of at least one of the chip regions. When either one of the probe card and the pogo connector is determined to be defective, the tester is connected to the conductive film through the probe card.

In one embodiment, the conductive film provides a current path with respect to a plurality of tips included in the probe card. In one embodiment, when a current flowing through one of the plurality of current paths deviates from an allowed range, the tester determines one of the pogo connector and the probe card to be defective.

According to another aspect, the present invention is directed to a test system which comprises a tester configured to test a wafer; a pogo connector having a plurality of pogo pins coupled with an output of the tester; and a conductive plate configured to provide a current path through a connection with the pogo connector when the pogo connector is determined to be defective.

In one embodiment, the conductive plate provides a resistance to the current path formed respectively with respect to the plurality of pogo pins.

According to another aspect, the present invention is directed to a method of checking a defect of a semiconductor test apparatus for testing a wafer which comprises connecting a probe card to a test pattern formed on a wafer to test whether the semiconductor test apparatus is defective; replacing the probe card with a probe card for test having a conductive plate when the test result indicates that the semiconductor test apparatus is defective; testing the semiconductor test apparatus using the replaced probe card for test; and determining whether either one of the probe card and the pogo connector is defective, based on the test result.

In one embodiment, the conductive plate of the probe card for test is formed of a metal film which is grounded and is formed on a contact surface where the probe card for test is connected with the pogo connector.

In one embodiment, the conductive plate provides a predetermined resistance with respect to each of the pogo pins of the pogo connector.

In one embodiment, the wafer has a test pattern formed on one of chip regions.

In one embodiment, the probe card is determined to be defective when a current obtained through the probe card for test is within an allowed range; and the pogo connector is determined to be defective when a current obtained through the probe card for test deviates from the allowed range.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

Figure 1:
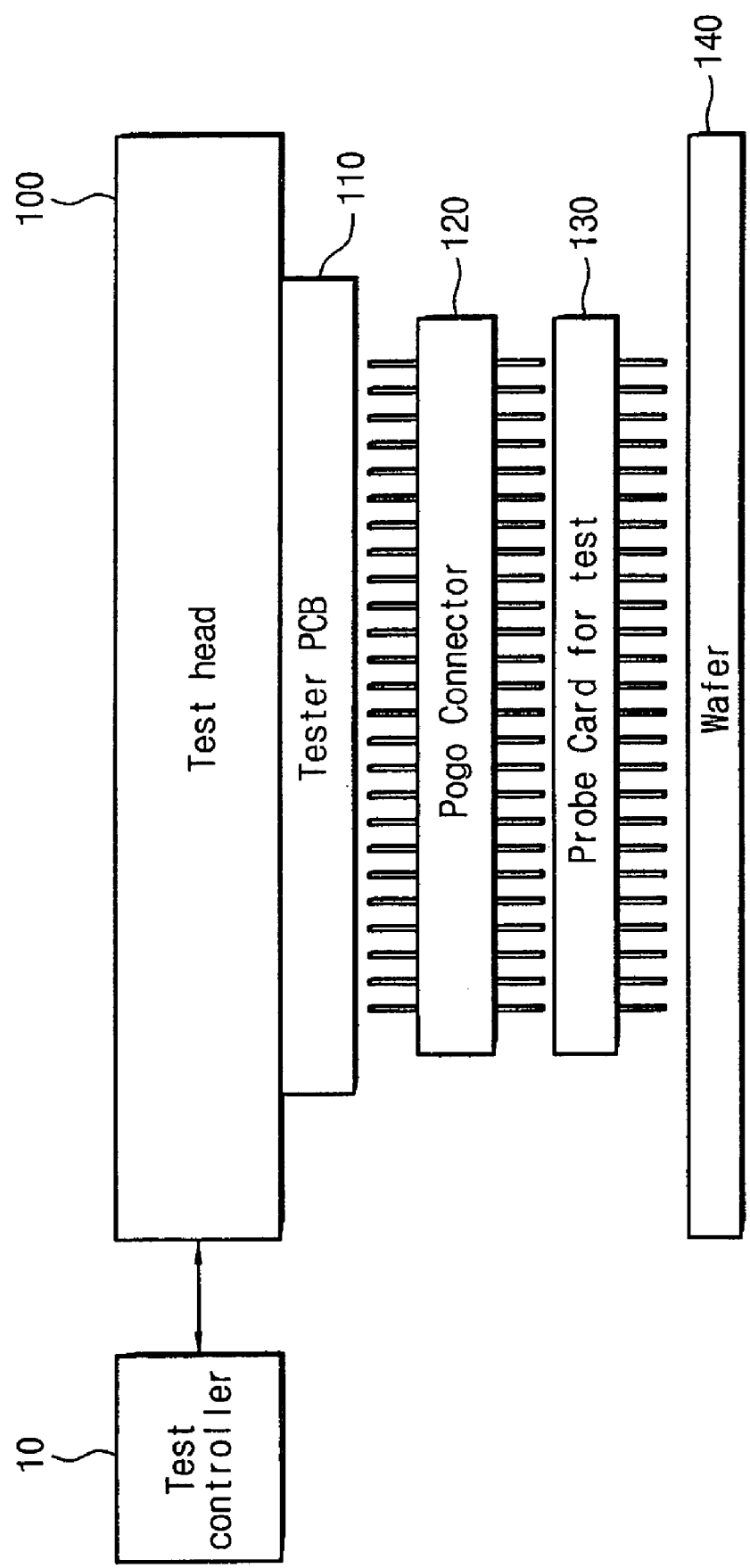
FIG. 1 is a diagram showing a test apparatus according to an embodiment of the present invention.

FIG. 1 is a diagram showing a test apparatus according to one embodiment of the present invention. Referring to FIG. 1, a test apparatus according to the present invention includes a test controller 10, a test head 100, a tester PCB 110, a pogo connector 120, and a probe card 130.

The test controller 10 is configured to provide data and electrical signals for a test operation. The test controller 10 is configured to receive signals and data detected during the test operation and to determine whether a die under test (hereinafter, referred to as "DUT") is a good die. In a conventional case, although a DUT is a good die, it can be determined to be a bad die because of the above-described minute dust or misalignment. As good dies are characterized as bad dies, the test operation can cause inefficiency and increased cost in the fabrication process. The test controller 10 according to the present invention is configured to determine whether a test apparatus is malfunctioning or a chip/die is bad when bad chips are continuously detected. This can be accomplished through a test pattern that is formed on a wafer according to the present invention, which will be more fully described below.

The test head 100 is configured to receive data or electrical signals from the test controller 10 and to transfer the received data or electrical signals to a probe station where a wafer is tested. The test head 100 is configured to receive control signals from the test controller 10 and to output the received control signals via output terminals.

The tester PCB 110 has an output portion for outputting electrical signals that are transferred to the probe station from the test head 100. The tester PCB 110 has an input portion for receiving test result signals to be transferred to the test controller 10 in response to a test signal from the probe station. This configuration may be provided in a PCB form that can be installed at the test head 100.

The pogo connector 120 includes pogo pins of a buffer material that is added for an electrical connection with the probe card 130. In general, when electrical test signals are transferred, problems can be caused when conductive dust is inserted between pogo pins or when non-conductive particles are adhered at contact points of the pogo pin and the probe card or of the pogo pin and the tester PCB 110. In this case, levels of test signals from the test head 100 can deviate from a normal level.

According to the invention, the probe card 130 for test is a card that is installed to check the condition of the present test apparatus. At a normal wafer test operation, instead of the probe card 130 for test, a conventional probe card may be installed to transfer test signals to the chip die through a connection with pads of a chip. In a case where a test failure is continuously generated although a chip die is normal, the probe card 130 according to the present invention can be used to check whether any of the test head 100, the tester PCB and the pogo connector 120 is malfunctioning. The probe card 130 may include means for checking a variation of contact resistance through a connection with pogo pins of the pogo connector 120, which will be more fully described below.

A wafer 140 includes means for checking the malfunctioning of the test head 100, the tester PCB 110, the pogo connector 120, and a probe card (not shown). In a case where test signals having a normal level are not transferred due to the inflow of conductive or non-conductive particles in the probe card, the test controller 10 may determine a test operation to have failed. In the case of repeated failures, the test controller 10 shifts the probe card to a test pattern provided on the wafer 140 of the present invention so as to make tips of the probe card be connected to the test pattern of the wafer 140. The test controller 10 determines whether the failure is caused by a bad chip or the tester and determines the execution of the test operation based on the determination result. If electrical characteristics obtained through electrical connection between the test pattern and the probe card are within an allowed range, the test apparatus may be determined to be normal. If the obtained characteristics are not within the allowed range, the test apparatus may be determined to be abnormal. In this case, the test controller 10 may determine a position of a malfunction.

In this embodiment, the pogo connector 120 and the probe card 130 for test constitute an interface unit that is configured to interface between a tester and the wafer 140.

As set forth above, the test system according to the present invention provides means for checking a defect of a chip die or a test apparatus during testing. Further, the test system according to the present invention provides means for tracking position of a failure of the test apparatus. Thus, it is possible to improve the test efficiency.

Figure 2:
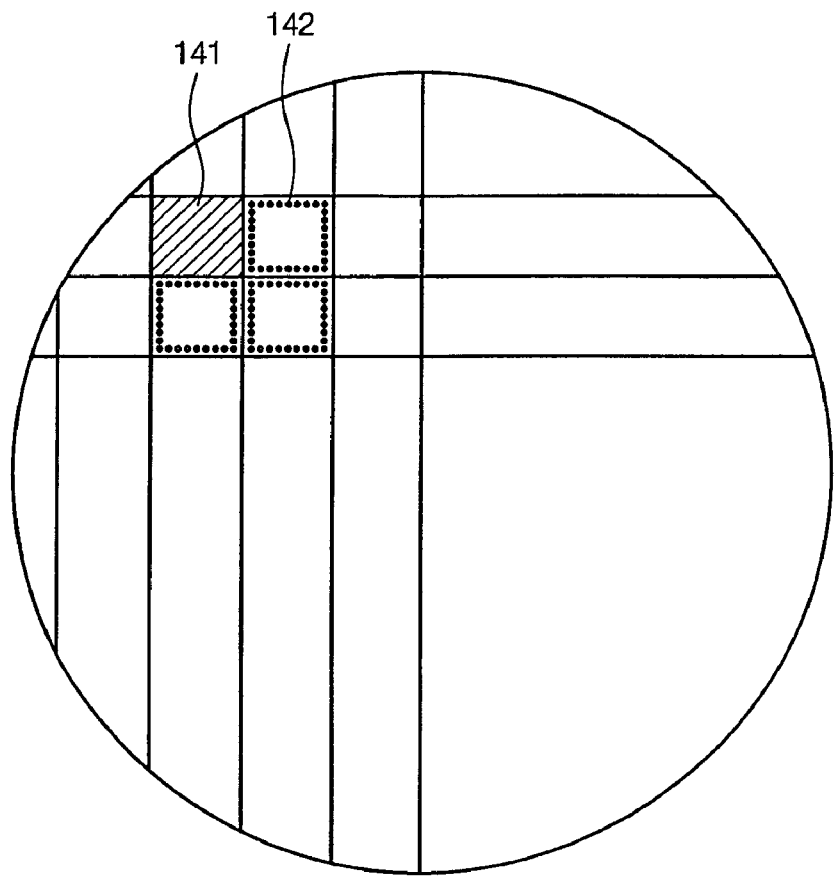
FIG. 2 is a diagram showing a wafer used for testing a test apparatus according to the present invention.

FIG. 2 is a diagram showing a wafer used for testing a test apparatus according to the present invention. A wafer according to the present invention includes a test pattern 141 that is formed on the wafer to check a die-level defect or a tester-level defect.

The test pattern 141 is a specific pattern that is formed of a conductive film, such as a metal film, and is formed on the wafer 140. The wafer 140 of a conventional silicon material includes chip dies where integrated circuits are formed through a fabrication process. Each of the chip dies may include pads connected with tips of the probe card. Alternatively, the test pattern 141 can be provided at a specific region of the wafer 140 and formed of a conductive, e.g., metal, film without pads. This metal film is connected with tips of a probe card and provides the test apparatus with electrical characteristics according to specific resistance values. The test pattern 141 according to the present invention may be formed simultaneously when a metal film is formed on the chip dies of the wafer. A mirror region provided for an alignment of a convention wafer can be used as the test pattern 141. The test pattern 141 of the present invention can be formed of other films instead of the metal film. For example, it is possible to form the test pattern using a conductive film having a predetermined specific resistance value.

The chip die 142 is an integrated circuit that is connected with tips of a probe card during testing and receives electrical signals to output test signals. According to the present invention, in a case where problems are generated at the test apparatus due to the inflow of conductive or non-conductive dust although the chip die 142 has not failed, it is possible to manage such problems. In addition, in a case where chip dies 142 are repeatedly failed during testing, a probe card is shifted to the test pattern under the control of the test controller 10 so as to test whether the test apparatus is malfunctioning.

As set forth above, in the case that chip dies 142 are repeatedly failed during testing, the probe card is shifted and connected to and with the test pattern 141. In a case where chip dies 142 are repeatedly failed during testing or at the beginning of the test operation, the probe card is shifted and connected to and with the test pattern 141. Afterwards, it is possible to determine whether any one of the chip die and the test apparatus is abnormal, based on expected electrical characteristics obtained from the test pattern 141.

Figure 3:
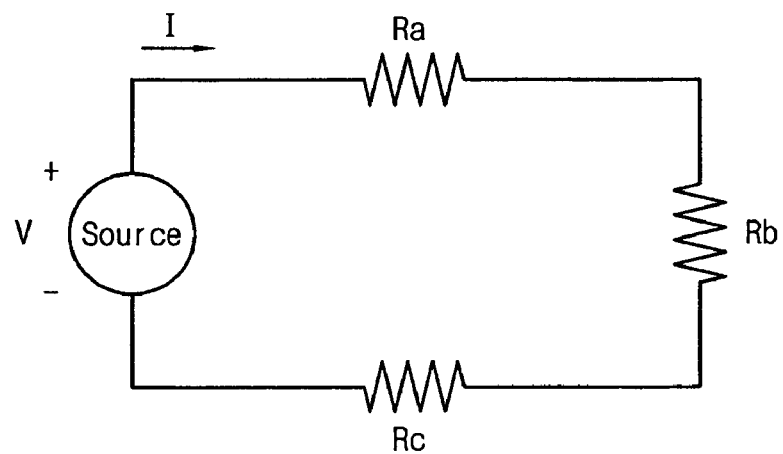
FIG. 3 is a schematic diagram showing an equivalent circuit illustrating a test concept according to the present invention.

FIG. 3 is a diagram showing an equivalent circuit for describing a test approach according to the present invention. There may be configured a circuit illustrated by contact resistances of each pin according to a current or voltage source of the test head 100. This circuit configuration may be modeled with respect to each pin.

A resistance Ra indicates a contact resistance between a pogo pin of a pogo connector 120 and a connection terminal of a tester PCB 110, and a resistance Rb is a contact resistance of a part where a pogo pin of the pogo connector 120 is connected to a connection terminal of a probe card. A resistance Rc is a contact resistance caused when a tip of the probe card is connected with the test pattern 141. Expected ranges of the resistances Ra, Rb and Rc are determined before testing in consideration of normal testing conditions. In an abnormal case, any one of the resistances Ra, Rb and Rc may be out of its expected range. This causes a current characteristic to deviate from an expected range with respect to an applied current or voltage. For example, if the resistance Rc is increased due to adhesion of non-conductive particles to tips of a probe card, a current may deviate from a normal range. In a case where an extraneous material is adhered to a pogo pin at a lower or upper side of the pogo connector 120 or where a connection is degraded, either one of the resistances Ra and Rb is varied, so that a current may deviate from an expected range. In this case, the test controller 10 determines the test apparatus to be malfunctioning, and the test controller 10 can issue an external alarm.

As understood from the above description, it is possible to determine whether the test apparatus is malfunctioning or a chip die is abnormal. Accordingly, in a case where the test apparatus is malfunctioning, means is needed to determine a position of a cause of the malfunction in the test apparatus, which will be more fully described below.

Figure 4:
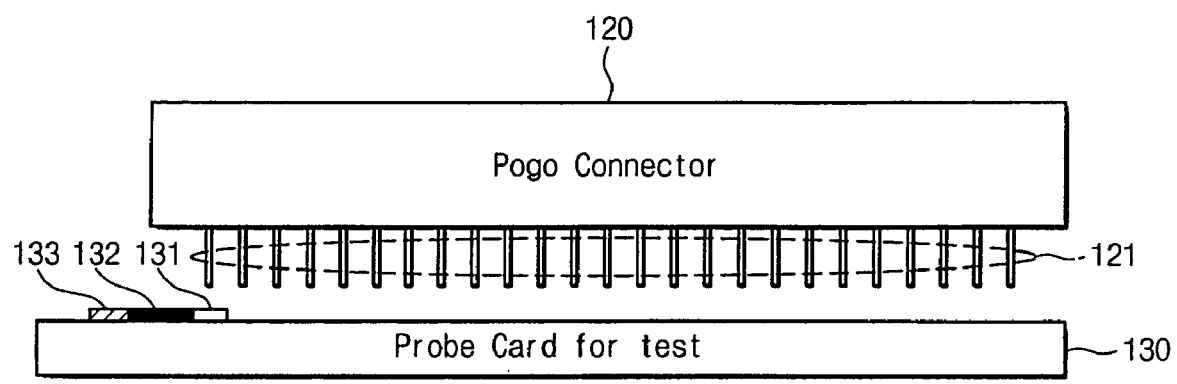
FIG. 4 is a diagram showing a probe card system according to one embodiment of the present invention.

FIG. 4 is a diagram illustrating a test method performed after it has been determined that the test apparatus or a chip die is causing a failure, using the test pattern 141. Referring to FIG. 4, in a case where the test apparatus is determined to be malfunctioning, a probe card 130 for test is means for detecting whether the probe card is malfunctioning or whether other elements are malfunctioning.

A pogo connector 120 is connected with the probe card 130 for test through a plurality of lower pogo pins 121. The probe card 130 for test includes a plurality of connection terminals 131 to 133 that correspond to the pogo pins 121, respectively. The connection terminals 131 to 133 include a contact terminal 131, a resistance 132 and a ground terminal 133 connected to the lower pogo pins 121 respectively. Accordingly, a predetermined resistance Ra within an expected range can be provided with respect to each pin. If lower and upper pins are under the cause of the malfunction, the resistances Ra and Rb may vary, which will be detected through current deviating from an expected range.

Figure 5:
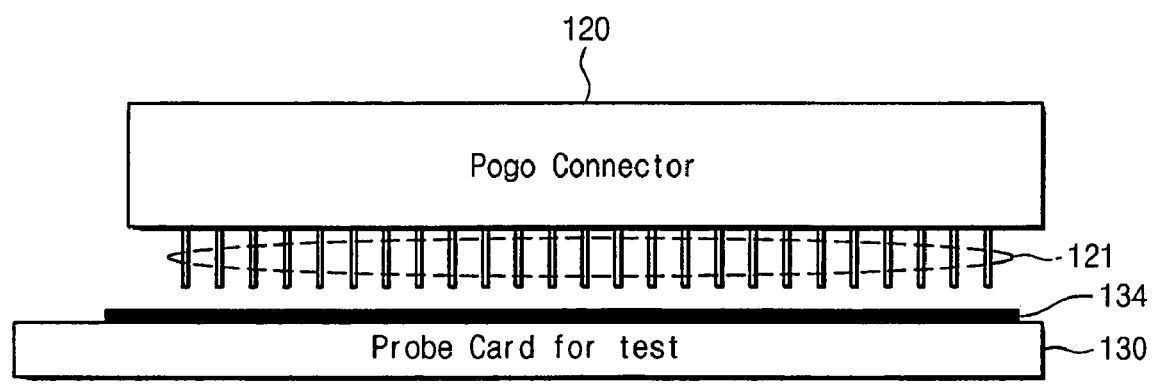
FIG. 5 is a diagram showing a probe card system according to another embodiment of the present invention.

FIG. 5 is a diagram showing a probe card for test according to another embodiment of the present invention. Referring to FIG. 5, it is possible to make the configuration of the contact terminals 131 to 133 more simply.

A probe card 130 for test according to another embodiment of the present invention includes a contact terminal 134 that is formed of a conductive film grounded with respect to lower pogo pins. The contact terminal 134 formed of the conductive film is connected to the lower pogo pins 121 to supply a ground voltage. A contact resistance is made when the conductive film 134 is contacted with the lower pogo pins 121. If a problem is caused by the lower pogo pins 121 or a previous stage of a test element, a resistance Ra or Rb of a circuit formed with respect to each pin may deviate from an allowed range. In this case, a current magnitude with respect to an applied power supply voltage deviates from the allowed range. This means that a previous stage of the probe card is malfunctioning. If the magnitude of a detected current is within the allowed range, the probe card may be determined to be malfunctioning. Accordingly, the probe card may be repaired or replaced.

Figure 6:
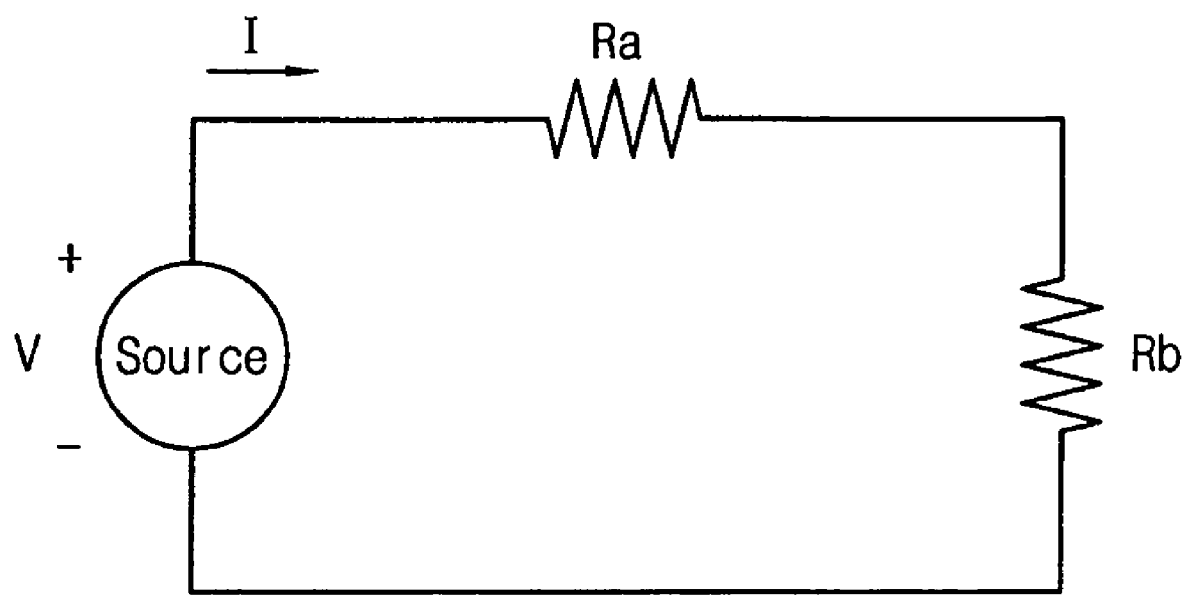
FIG. 6 is a diagram showing an equivalent circuit of a probe card system illustrated in FIG. 4 or 5.

FIG. 6 is a diagram showing an equivalent circuit of a probe card system illustrated in FIG. 4 or 5. Referring to FIG. 6, an equivalent circuit is a circuit when the probe card 130 for test is utilized. A resistance Rb may be set to an expected value as the probe card for test is installed.

If a problem arises at a probe card, a current within an allowed range may be detected when a voltage V is applied from a test head 100. This means that the probe card is malfunctioning. A test controller 10 may alarm such that the probe card is replaced. But, in a case where a current amount deviating from the allowed range is detected, it may be determined that the problem is caused by a pogo connector 120 or a test head 100. In this case, the test controller 10 may alarm such that the pogo connector 120 or other test elements are checked.

Figure 7:
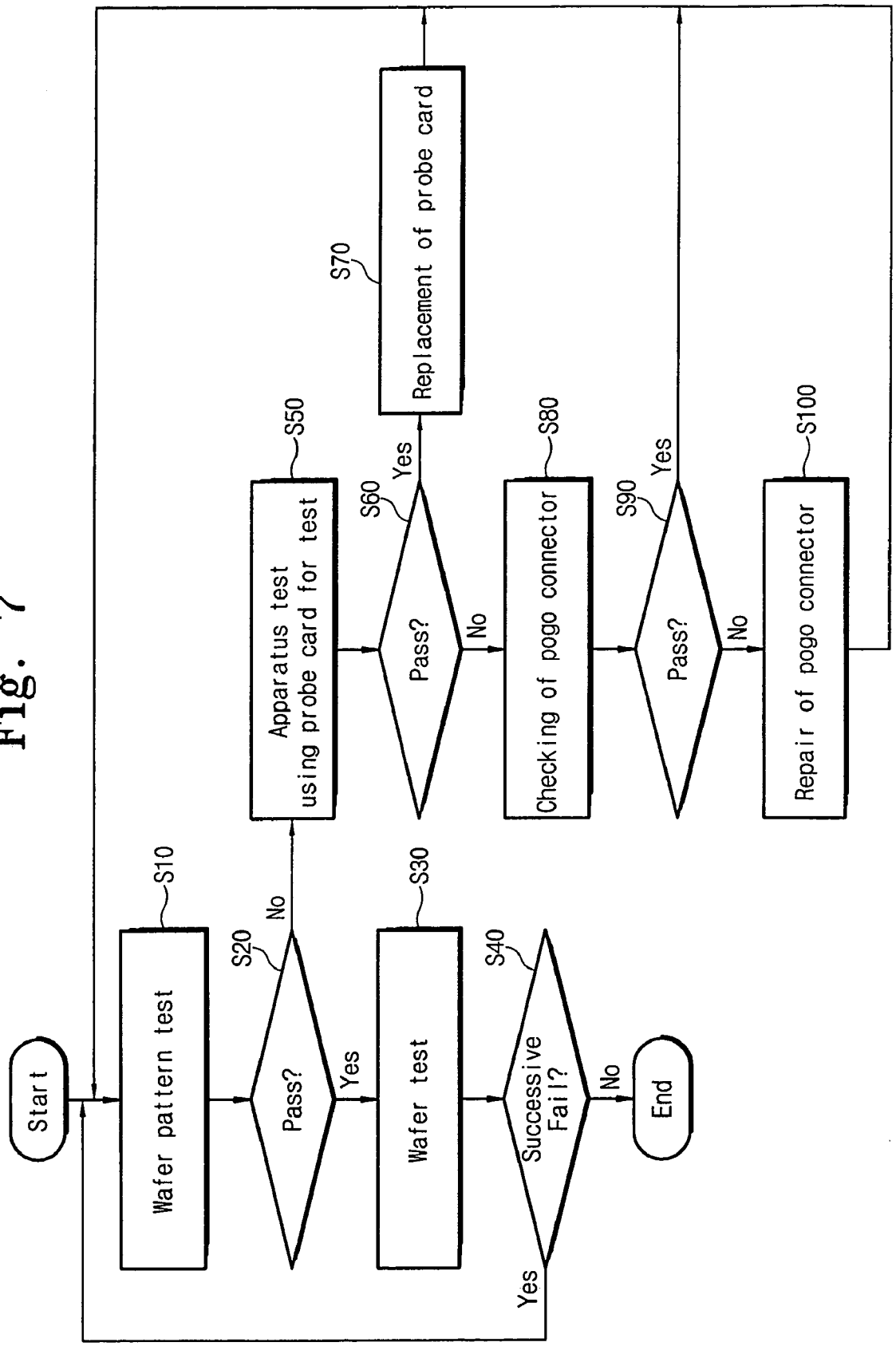
FIG. 7 is a flowchart illustrating a test method according to one embodiment of the present invention.

FIG. 7 is a flowchart illustrating a test method according to an embodiment of the present invention.

A test operation commences through a test of the pattern 141 on a wafer 140 to confirm normal operation of the test apparatus. In step S10, a test controller 10 shifts a probe card to the test pattern 141 on the wafer 140 formed of a metal film or a conductive film and checks electrical characteristics of the test apparatus. In step S20, it is determined whether the test result indicates that the test apparatus is normal. If the test result indicates that the test apparatus is normal, the procedure proceeds to step S30, in which the probe card is shifted from the test pattern 141 to other integrated circuits 142 to execute a wafer test operation. In step S40, it is determined whether integrated circuits 142 are repeatedly or successively determined to be bad dies during the wafer test operation. In a case where integrated circuits 142 are repeatedly determined to be bad dies during the wafer test operation, such a phenomenon is dependant upon the malfunction of the test apparatus rather than a defect in the integrated circuits, that is, chip dies. If integrated circuits 142 are repeatedly determined to be failures, the procedure returns to step S10.

On the other hand, if the test result indicates that the test apparatus is abnormal, the procedure proceeds to step S50 to determine a position of a defect. In particular, it is determined whether the probe card is malfunctioning by installing a probe card 130 for test according to the present invention. If a result obtained through the probe card 130 for test indicates that electrical characteristics are normal, the probe card is determined to be malfunctioning. If the result obtained through the probe card 130 for test indicates that electric characteristics deviate from an allowed range, any of the test head 100, the tester PCB 110, and the pogo connector 120 is determined to be malfunctioning. Accordingly, if electrical characteristics of the probe card 130 for test are normal, in step S70, the test controller 10 alarms such that the probe card is replaced. Afterwards, the procedure proceeds to step S10.

On the other hand, in a case where the test result is abnormal, the procedure proceeds to step S80, in which the pogo connector 120 is checked. If the pogo connector 120 is determined to be normal, the procedure proceeds to step S10. If the malfunction of test elements including the pogo connector 120 is detected (S90), the malfunction of the pogo connector 120 or other test elements is repaired (S100). Afterwards, the procedure proceeds to step S10.

As understood from the above description, the test method according to the present invention comprises checking whether a test apparatus is malfunctioning; and determining a position of a malfunction of the test apparatus. With this test method, it is possible to rapidly detect the malfunction of the test apparatus frequently caused during a test process and to rapidly repair the test apparatus based on the detected result.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of checking a defect of a semiconductor test apparatus for testing a wafer comprising:
    providing a pogo connector connected to a tester of the semiconductor test apparatus;
    connecting a probe card to the pogo connector and to a test pattern formed on a wafer to test whether the semiconductor test apparatus is defective;
    replacing the probe card with a probe card for test having a conductive plate when the test result indicates that the semiconductor test apparatus is malfunctioning;
    testing the semiconductor test apparatus using the replaced probe card for test; and
    determining whether either one of the probe card and the pogo connector is defective, based on the test result,
    wherein the probe card is determined to be defective when a current obtained through the probe card for test is within an allowed range; and the pogo connector is determined to be defective when a current obtained through the probe card for test deviates from the allowed range.

2. The method of claim 1, wherein the conductive plate of the probe card for test is formed of a metal film which is grounded and is formed on a contact surface where the probe card for test is connected with the pogo connector.

3. The method of claim 1, wherein the conductive plate provides a predetermined resistance with respect to each of the pogo pins of the pogo connector.

4. The method of claim 1, wherein the wafer has a test pattern formed on one of chip regions.

* * * * *